US012705408B2

(12) United States Patent
Banadyha et al.

(10) Patent No.: US 12,705,408 B2
(45) Date of Patent: Aug. 11, 2026

(54) GENERATING A VARIABLE STIFFNESS STRUCTURE BASED ON A PERSONAL PRESSURE MAP

(71) Applicant: AUTODESK, INC., San Francisco, CA (US)

(72) Inventors: Andriy Banadyha, London (GB); Hooman Shayani, London (GB); Anthony Ruto, London (GB); Bhupendra Lodhia, London (GB)

(73) Assignee: AUTODESK, INC., San Francisco, CA (US)

(*) Notice: Subject to any disclaimer, the term of this patent is extended or adjusted under 35 U.S.C. 154(b) by 1023 days.

(21) Appl. No.: 16/898,194

(22) Filed: Jun. 10, 2020

(65) Prior Publication Data

US 2021/0117589 A1 Apr. 22, 2021

Related U.S. Application Data

(60) Provisional application No. 63/034,363, filed on Jun. 3, 2020, provisional application No. 62/924,049, filed on Oct. 21, 2019.

(51) Int. Cl.

| | |
|---|---|
| ***G06F 30/20*** | (2020.01) |
| ***A43B 17/00*** | (2006.01) |
| ***B29C 64/20*** | (2017.01) |
| ***B33Y 50/02*** | (2015.01) |
| ***B33Y 80/00*** | (2015.01) |
| ***G06F 30/10*** | (2020.01) |

(52) U.S. Cl.

CPC ............ *G06F 30/20* (2020.01); *A43B 17/003* (2013.01); *B29C 64/20* (2017.08); *G06F 30/10* (2020.01); *B33Y 50/02* (2014.12); *B33Y 80/00* (2014.12)

(58) Field of Classification Search

CPC ......... G06F 30/20; G06F 30/23; B33Y 80/00; B33Y 50/02; B29C 64/20; B29C 64/386; A43B 17/003; A43D 1/02

See application file for complete search history.

(56) References Cited

U.S. PATENT DOCUMENTS

| | | | | |
|---|---|---|---|---|
| 2007/0011913 A1* | 1/2007 | Holzer | .................. | A43B 7/125<br>36/50.1 |
| 2014/0298682 A1* | 10/2014 | Cavanagh | ........... | A43B 13/183<br>36/43 |
| 2015/0217520 A1* | 8/2015 | Karpas | ................. | B29C 64/118<br>700/98 |
| 2016/0107391 A1* | 4/2016 | Parish | ................... | B33Y 10/00<br>700/98 |

* cited by examiner

*Primary Examiner* — Ryan F Pitaro

*Assistant Examiner* — Bernard E Cothran

(74) *Attorney, Agent, or Firm* — Artegis Law Group, LLP

(57) ABSTRACT

A computer-implemented method of generating one or more variable stiffness structures includes determining a thickness of a first portion of a variable stiffness structure; determining a pressure that is to be applied to a surface of the first portion; selecting a first predetermined value for a stiffness attribute based on the thickness of the first portion and the pressure; and generating a model of at least part of the variable stiffness structure that includes the first portion, wherein the first portion has the predetermined value for the stiffness attribute.

21 Claims, 10 Drawing Sheets

700

304

| Structure Thickness | | | | | | | | | | | | | | | | | | |
|---|---|---|---|---|---|---|---|---|---|---|---|---|---|---|---|---|---|---|
| 12 mm | 2.35 | 2.5 | 2.65 | 2.8 | 2.95 | 3.1 | 3.25 | 3.4 | 3.55 | 3.7 | 3.85 | 4 | 4.15 | 4.3 | 4.45 | 4.6 | 4.75 | Stiffness Attribute Value |
| | 2.7132 | 2.7132 | 2.055 | 1.6513 | 1.3746 | 0.9976 | 0.8556 | 0.4482 | 0.6579 | 0.5601 | 0.5179 | 0.4605 | 0.406 | 0.3587 | 0.3101 | 0.2725 | 0.2396 | Displacement |
| 14.5 mm | 2.42 | 2.595 | 2.77 | 2.945 | 3.12 | 3.295 | 3.47 | 3.645 | 3.82 | 3.995 | 4.17 | 4.345 | 4.52 | 4.695 | 4.87 | 5.045 | 5.22 | Stiffness Attribute Value |
| | 2.7132 | 2.1615 | 1.7518 | 1.4706 | 1.2508 | 1.0791 | 0.9336 | 0.8191 | 0.7176 | 0.6498 | 0.5724 | 0.5041 | 0.4461 | 0.392 | 0.3405 | 0.2769 | 0.2396 | Displacement |
| 17 mm | 2.56 | 2.7313 | 2.905 | 3.0739 | 3.245 | 3.4163 | 3.5878 | 3.7588 | 3.93 | 4.1013 | 4.2725 | 4.4438 | 4.615 | 4.7863 | 4.9575 | 5.1288 | 5.3 | Stiffness Attribute Value |
| | 2.7132 | 2.1965 | 1.8303 | 1.5534 | 1.3235 | 1.138 | 0.9896 | 0.8628 | 0.7581 | 0.6605 | 0.5808 | 0.505 | 0.4401 | 0.381 | 0.3287 | 0.2774 | 0.2396 | Displacement |
| 19.5 mm | 2.7 | 2.875 | 3.05 | 3.225 | 3.4 | 3.575 | 3.75 | 3.925 | 4.1 | 4.275 | 4.45 | 4.625 | 4.8 | 4.975 | 0.515 | 5.325 | 5.5 | Stiffness Attribute Value |
| | 2.7132 | 2.2579 | 1.9256 | 1.6413 | 1.4085 | 1.2296 | 1.076 | 0.9388 | 0.8225 | 0.7226 | 0.6302 | 0.5448 | 0.4693 | 0.4015 | 0.34 | 0.2855 | 0.2396 | Displacement |
| 22 mm | 2.8 | 2.975 | 3.15 | 3.325 | 3.5 | 3.675 | 3.85 | 4.025 | 4.2 | 4.375 | 4.55 | 4.725 | 4.9 | 5.075 | 5.25 | 5.425 | 5.6 | Stiffness Attribute Value |
| | 2.7132 | 2.2572 | 1.9355 | 1.6664 | 1.4458 | 1.2641 | 1.1125 | 0.9836 | 0.8563 | 0.7542 | 0.6547 | 0.5747 | 0.4892 | 0.4149 | 0.3498 | 0.2905 | 0.2396 | Displacement |

GENERATING A VARIABLE STIFFNESS STRUCTURE BASED ON A PERSONAL PRESSURE MAP

CROSS-REFERENCE TO RELATED APPLICATIONS

The present application claims the priority benefit of U.S. Provisional Application titled, "NON-LINEAR OPTIMIZATION BASED ON PERSONAL PRESSURE MAP," filed Oct. 21, 2019 and having Ser. No. 62/924,049 and also claims the priority benefit of U.S. Provisional Application titled, "GENERATING A VARIABLE STIFFNESS STRUCTURE BASED ON A PERSONAL PRESSURE MAP," filed Jun. 3, 2020, and having Ser. No. 63/034,363. The subject matter of these related applications is hereby incorporated by reference in its entirety.

BACKGROUND

Field of the Various Embodiments

The disclosed embodiments relate generally to computer science and, more specifically, to generating a variable stiffness structure based on a personal pressure map.

Description of the Related Art

When an object exerts a force against a part of a person's body, any high concentration of pressure is typically perceived as uncomfortable to that person, especially when the high pressure lasts for an extended period of time. For instance, the presence of any small object between a person's foot and the insole of that person's shoe can be highly uncomfortable and can even result in injury. In an effort to reduce high concentrations of pressure against the human body, surfaces that are intended to contact a given part of the human body are usually designed such that the contact forces are distributed across larger areas.

To that end, foams and other compressible materials have been employed in shoe insoles, seat cushions, and similar applications to distribute various contact forces over larger areas of the user's body to increase overall user comfort. One drawback of using such materials is that these types of materials are not especially durable. Consequently, these types of materials can lose elasticity and their ability to distribute contact forces over sufficiently large areas.

Another approach to reducing high concentrations of pressure resulting from contact forces is to customize more durable material to fit a particular part of a person's body. For example, customized shoe insoles can be produced for a person based on the shape of the bottom of the person's foot. Ideally, however, to evenly distribute force across the bottom of a person's foot, the shape of the bottom of the person's foot and the related pressure distribution across the bottom of the person's foot should be accounted for when designing a shoe insole. But accurately analyzing the pressure distribution across the three-dimensional surface of a shoe insole (or other structure) and determining the different displacements across that three-dimensional surface in response to pressure being exerted across the three-dimensional surface is a complex computational problem that is difficult, if not impossible, to solve. Because the solution involves non-linear static analysis of the three-dimensional surface and the material properties of the shoe insole, computing a solution within a realistic time frame, even when using cloud-based computing resources, may not be feasible.

To reduce computational complexity, finite element analysis based on linear static analysis of the three-dimensional surface of a structure could be used to determine the pressure distribution across the three-dimensional surface, such as a shoe insole. However, finite element analysis typically yields poor results. Because linear static simulation cannot support multi-target optimization in a single loading case, there is only one target in linear static analysis. For instance, linear static simulation cannot calculate a structural solution that has a different target displacement for each of the hundreds or thousands of different finite elements of a three-dimensional surface. Instead, a linear static simulation can only generate a structural solution optimized to have a single target displacement of the three-dimensional surface. As a result, good contact pressure distribution across the three-dimensional surface cannot be realized with such a structural solution, since optimized pressure distribution relies on different target displacements for each different location on the three-dimensional surface.

As the foregoing illustrates, what is needed in the art are more effective techniques for generating a customized structure that provides even pressure distribution when in contact with a user.

SUMMARY

One embodiment of the present disclosure sets forth a technique for generating one or more variable stiffness structures includes determining a thickness of a first portion of a variable stiffness structure; determining a pressure that is to be applied to a surface of the first portion; selecting a first predetermined value for a stiffness attribute based on the thickness of the first portion and the pressure; and generating a model of at least part of the variable stiffness structure that includes the first portion, wherein the first portion has the predetermined value for the stiffness attribute.

At least one technical advantage of the disclosed techniques relative to the prior art is that the disclosed techniques enable a variable stiffness structure to be generated for a given person based on a pressure map that is specific to that person. Another technical advantage is that the computational process of generating a design for the variable stiffness structure can be completed relatively quickly, even though the design incorporates stiffness attributes that are calculated using non-linear static simulation of the variable stiffness structure. Further, because the stiffness attributes of the variable stiffness structure are calculated using non-linear static simulation, the variable stiffness structure is configured to undergo a different displacement for each of multiple different points on the personalized interface surface. As a result, when in use, the variable stiffness structure better conforms to a particular body part of the user and more evenly distributes pressure over the body part of the user than a customized structure generated using prior art techniques. These technical advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 7 illustrates various stiffness attribute values generated via a non-linear simulation for a variable stiffness structure, according to various embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
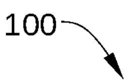
FIG. 1 illustrates a system configured to implement one or more aspects of the various embodiments.
Figure 1:
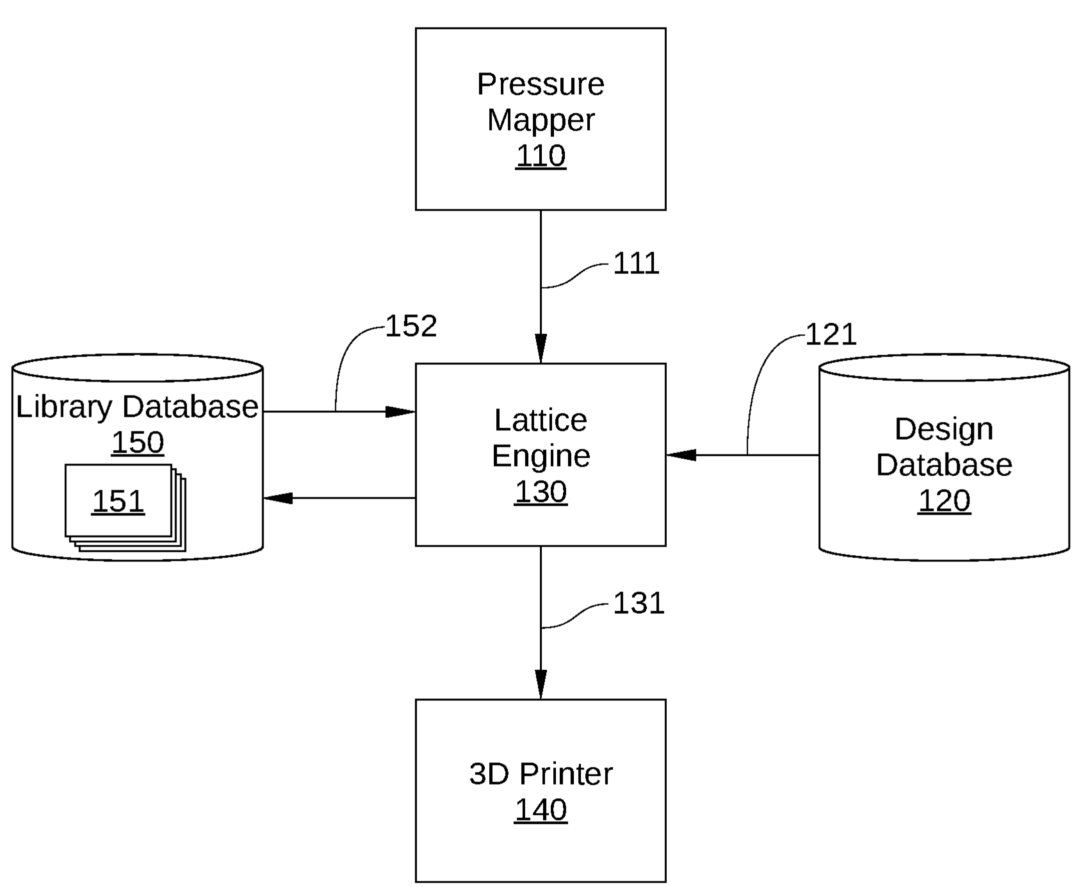

FIG. 1 illustrates interface structure generation system 100 configured to implement one or more aspects of the embodiments. Interface structure generation system 100 is configured to generate a design for a variable stiffness structure (not shown) with a high-comfort, personalized interface surface, based on a pressure map for a specific user. The personalized interface surface can be any surface intended to exert force against a part of a person's body for an extended period of time, at high magnitude, or a combination of both. For example, the personalized interface surface can be a surface of a shoe insole, a seat cushion, an arm rest, and the like. The variable stiffness structure is configured to deform when the personalized interface surface contacts the targeted user so that the pressure exerted against the user is distributed evenly and over most or all of the available surface. As a result, any high concentration of pressure is prevented, and the pressure exerted against the user is not perceived as uncomfortable to the user, even when the exerted pressure is present for an extended period.

As shown, interface structure generation system 100 includes a pressure mapper 110, a design database 120, a lattice engine 130, a 3D printer 140, and a library database 150.

Pressure mapper 110 is configured to generate a personal pressure map 111 of an interface surface (not shown) that is configured to exert pressure against a user's body. Generally, pressure mapper 110 can be any suitably configured pressure distribution measuring system for monitoring local loads at a plurality of locations on the interface surface. For example, pressure mapper 110 can be configured to measure pressure at a plurality of locations on an insole surface of a shoe, thereby quantifying the pressure distribution between a particular user's foot and a shoe. Interface surfaces for which pressure mapper 110 can be configured to generate pressure map 110 can be included on any other device, apparatus, appliance, or vehicle that is contacted by a user, such as a bicycle seat, a brake pedal, a wheelchair cushion, an office chair, and the like. One embodiment of personal pressure map 111 is described below in conjunction with FIG. 2.

Figure 2:
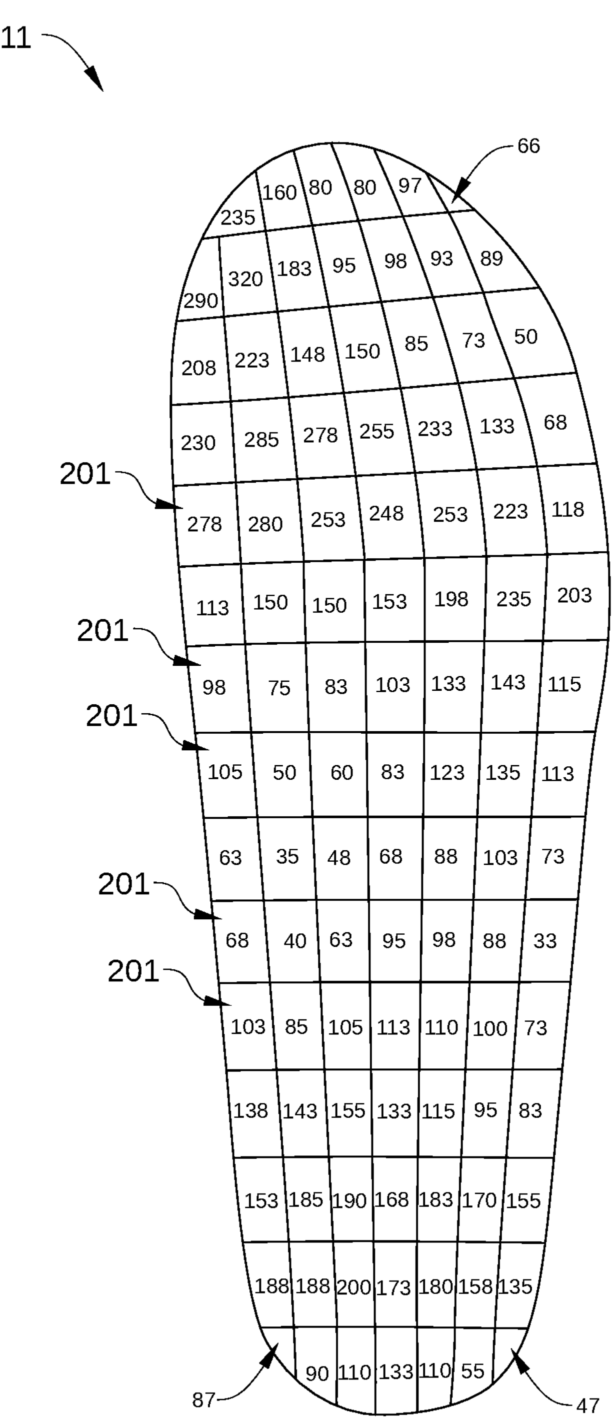
FIG. 2 is a schematic illustration of a personal pressure map generated by the pressure mapper of FIG. 1, according to various embodiments.

FIG. 2 is a schematic illustration of a personal pressure map 111 generated by pressure mapper 110, according to various embodiments. In the embodiment illustrated in FIG. 2, personal pressure map 111 depicts a pressure distribution of a particular user standing on the interface surface of an insole of a shoe. According to various embodiments described herein, personal pressure map 111 can be employed to generate a shoe midsole or insert that includes a variable stiffness structure that is configured based on personal pressure map 111. As shown, personal pressure map 111 includes a value for a plurality of locations 201 across the interface surface of an insole of a shoe. Generally, each location 201 of personal pressure map 111 corresponds to an individual pressure sensor of pressure mapper 110. In some embodiments, a separate personal pressure map 111 is generated for each foot of a user and, consequently, a unique variable stiffness structure is generated for each shoe of the user.

In the embodiment illustrated in FIG. 2, personal pressure map 111 is depicted as a two-dimensional map of pressure measurements. In other embodiments, personal pressure map 111 can be in any other suitable format, such as a spreadsheet of values and measurement locations, a bitmap in which a grayscale value at any location indicates a specific range of pressure value, and the like.

In the embodiment illustrated in FIG. 2, personal pressure map 111 is generated for a single specific user. Alternatively, in some embodiments, personal pressure map 111 depicts a pressure distribution of a representative user standing on the interface surface of an insole of a shoe. In such embodiments, personal pressure map 111 may include average values for a particular category or cohort of user, such as a group of users sharing one or more pertinent characteristics, such as age, height, weight, body mass index (BMI), general foot geometry (wide, narrow, etc.) gender, and the like.

Returning to FIG. 1, design database 120 stores a plurality of designs for which lattice engine 130 can generate a variable stiffness structure for user comfort. For example, in one embodiment, design database 120 stores a plurality of different shoe designs, where each shoe design is configured to include a variable stiffness structure generated by lattice engine 130. In such an embodiment, lattice engine 130 generates the variable stiffness structure for a specific design of shoe to be customized with the variable stiffness structure. As described below, lattice engine 130 generates a design for the variable stiffness structure based in part on variable stiffness structure design information 121 stored in design database 120, where the variable stiffness structure design information 121 specifies form factor and material information for the specific design of the object, vehicle, or appliance that includes the variable stiffness structure. One embodiment of a variable stiffness structure is described below in conjunction with FIGS. 3A and 3B.

Figures 3A, 3B:
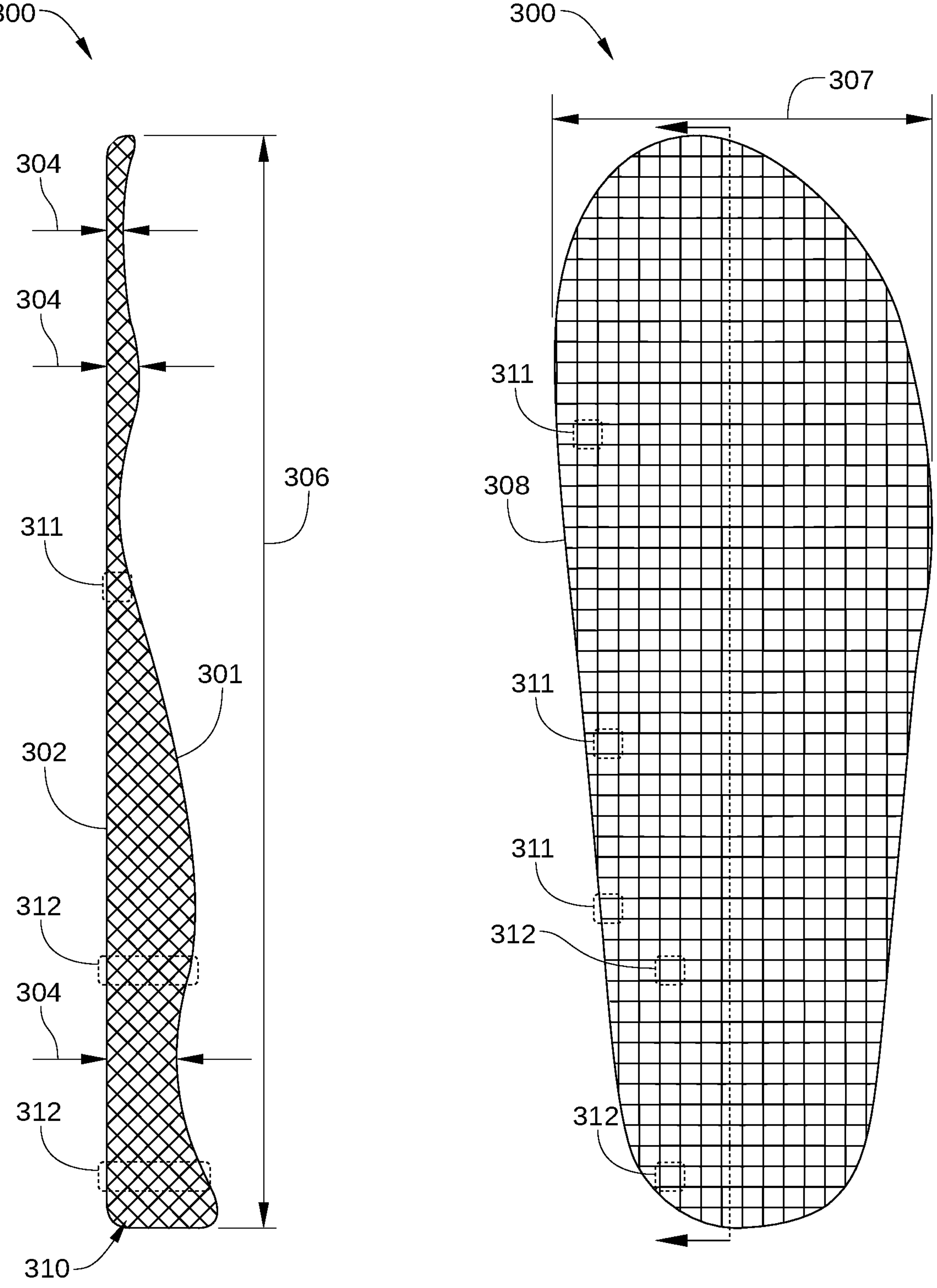
FIG. 3A schematically illustrates a side view of a shoe midsole, according to various embodiments.
FIG. 3B is a plan view of the shoe midsole of FIG. 3, according to various embodiments.

FIG. 3A schematically illustrates a side view of a shoe midsole 300, according to an embodiment, and FIG. 3B is a plan view of shoe midsole 300, according to the embodiment. Shoe midsole 300 has a maximum length 306, a maximum width 307, and a perimeter 308.

Shoe midsole 300 is an example variable stiffness structure that can be personalized for a particular user. That is, when a shoe that incorporates midsole 300 is worn by the particular user, the variable stiffness implemented in shoe midsole 300 is configured to improve pressure distribution over an interface surface 301. For example, in some embodiments, due to the personalized variable stiffness of structure shoe midsole 300, a maximum pressure exerted at any point on the foot of the user by interface surface 301 is minimized or otherwise reduced compared to a maximum pressure exerted on the foot of the user by an interface surface of a comparable conventional shoe midsole. Additionally or alternatively, in some embodiments, due to the personalized variable stiffness structure of shoe midsole 300, a differential between pressure exerted on the foot of the user by two adjacent portions of interface surface 301 is minimized or otherwise reduced compared to a pressure differential between adjacent portions of a comparable conventional shoe midsole.

As shown, shoe midsole 300 includes interface surface 301, which contacts a surface of the body of the user during normal use, and a bottom surface 302 located on an opposing side of shoe midsole 300 from interface surface 301. Shoe midsole 300 further includes a lattice 310 disposed between interface surface 301 and bottom surface 302. Lattice 310 is a 3D lattice structure that enables different portions of shoe midsole 300 to have different stiffness with respect to a distributed load that is directed substantially downward on and/or normal to interface surface 301. As a result, high-pressure load concentrated in a few portions of shoe midsole 300, for example regions disposed under the heel and the balls of the toes, can be distributed across a larger portion of interface surface 301, thereby enhancing the perceived comfort of the user when wearing a shoe that includes shoe midsole 300. In addition, pressure differential between adjacent portions of interface surface 301 can be smoothed across most or all of interface surface 301, further enhancing the perceived comfort of the user when wearing a shoe that includes shoe midsole 300.

Lattice 310 can be any repeating 3D structure having sufficient durability for the intended use of shoe midsole 300. In the embodiments illustrated in FIGS. 3A and 3B, lattice 310 includes an X-topology lattice. In such embodiments, one stiffness attribute can be a diameter or thickness of the beams or other structural members included in the X-topology lattice. In other embodiments, lattice 310 can include any other suitable 3D lattice structure.

In the embodiment illustrated in FIGS. 3A and 3B, lattice 310 includes a plurality of 3D unit cells 311 that each have a similar geometrical configuration. Thus, each unit cell 311 is configured to have sufficient durability for a specified number of pressure-exertion cycles of a specified magnitude. For example, in the case of a shoe midsole, the geometrical configuration of each unit cell 311 may include one or more durability features, such as structural members of at least a minimum threshold cross-sectional area, connection points between structural members having fillets of at least a minimum radius, etc.

While 3D unit cells 311 of shoe midsole 300 each have a similar geometrical configuration, 3D unit cells 311 are not identical in configuration. Instead, according to embodiments described herein, each 3D unit cell 311 can be configured to have a different stiffness with respect to a load 303 exerted on interface surface 301. That is, a stiffness attribute of each 3D unit cell 311 can be selected to have a different value than other 3D unit cells 311. For example, in some embodiments, the stiffness attribute of 3D unit cells 311 is a thickness or diameter of beams forming each 3D unit cell. In such embodiments, a higher thickness or greater diameter of such beams increases stiffness of the 3D unit cell 311. For clarity, differences in the thickness of the beams included in the X-topology lattice of lattice 310 are not shown in FIGS. 3A and 3B.

In some embodiments, stiffness of lattice 310 varies by portions that each include multiple 3D unit cells 311. In such embodiments, each 3D unit cell 311 included in a portion 312 of shoe midsole 300 can be configured to have the same stiffness with respect to load 303, while the stiffness in each portion 312 of shoe midsole 300 can be different from the stiffness of some or all other portions 312 of shoe midsole 300. In the embodiment illustrated in FIGS. 3A and 3B, such portions 312 are depicted as an array of contiguous 3D unit cells 311 arranged in a column that extends from bottom surface 302 to interface surface 301. In other embodiments, a portion 312 of shoe midsole 300 can include multiple columns of contiguous 3D unit cells 311. In yet other embodiments, a portion 312 of shoe midsole 300 can include any other group of contiguous 3D unit cells 311.

In embodiments in which each portion 312 of shoe midsole 300 includes one or more contiguous columns of 3D unit cells 311, each such column can have a different thickness 304. As shown in FIG. 3A, thickness 304 of a particular portion 312 is the distance between the region of interface surface 301 that is included in portion 312 and the region of bottom surface 302 that is included in portion 312. As described in greater detail below, lattice engine 130 selects a value of the stiffness attribute for a particular portion 312 of shoe midsole 300 based in part on thickness 304 of that particular portion 312. Thus, each portion 312 of shoe midsole 300 can have a different value for the stiffness attribute of that portion 312.

Returning to FIG. 1, variable stiffness structure design information 121 is stored in design database 120, where the variable stiffness structure design information 121 specifies form factor and material information for the specific design of the object, vehicle, or appliance that includes the variable stiffness structure. For example, when lattice engine 130 generates a design for shoe midsole 300 of FIG. 3, variable stiffness structure design information 121 may include form factor information such as the location and thickness 304 of each portion 312 within shoe midsole 300, area and/or volume information for each portion 312, maximum length 306, maximum width 307, the location of perimeter 308, and the like. Furthermore, in some embodiments, lattice engine 130 generates the design for the variable stiffness structure further based on sizing information for the object, vehicle, or appliance that includes the variable stiffness structure. For example, in such embodiments, variable stiffness structure design information 121 may include shoe sizing information when the variable stiffness structure under consideration is a shoe insole.

Additionally, variable stiffness structure design information 121 includes different target displacement for each of multiple regions of an interface surface of the variable stiffness structure. Specifically, each of the multiple regions is included in a different portion (e.g., portions 312 of FIG. 3) of the variable stiffness structure. In addition, the target displacement for each region of the interface surface is a displacement of that region that occurs when a specified load is applied to that region of the interface surface. In such embodiments, the specified load is generally based on information included in personal pressure map 111. For example, in an embodiment, the specified load is an average pressure of the pressures included in pressure map 111.

Lattice engine 130 is configured to generate a 3D design 131 for a variable stiffness structure based on variable stiffness structure design information 121, personal pressure map 111, and lattice stiffness information 152 from a specific lattice stiffness library 151. In some embodiments, lattice engine 130 is a software application configured to receive and process numeric and/or graphical information, lookup values for stiffness attributes and/or other lattice stiffness information 152 from an appropriate lattice stiffness library 151, generate a 3D design 131 for the variable stiffness structure, and capture the 3D design 131 in a format suitable for processing by 3D printer 140. Various operations performed by lattice engine 130 are described in greater detail below in conjunction with FIG. 9.

3D printer 140 is configured to form the personalized variable stiffness structure based on 3D design 131 generated by lattice engine 130. 3D printer 140 can be any technically feasible 3D printer device or other additive manufacturing device suitable for forming the particular material employed to form the variable stiffness structure of interest.

Library database 150 includes a plurality of lattice stiffness libraries 151. Each lattice stiffness library 151 includes stiffness attributes for a specific structure to be optimized by lattice engine 130. Generally, each specific structure with which a lattice stiffness library 151 is associated includes a unique combination of various physical attributes that can affect stiffness of the variable stiffness structure. For example, in some embodiments, the physical attributes of a specific structure include one or more of: lattice type, unit cell area of the lattice, unit cell height of the lattice, lattice material, and the like.

Example Lattice Structures

Because the variable stiffness structure to be designed is formed via 3D printer 140, any of a large variety of different lattice structures can be employed to form the variable stiffness structure. Suitable lattice structures include, without limitation, an X-topology lattice structure, a hexagonal cell lattice structure, a triangular cell lattice structure, and the like. One embodiment of an X-topology lattice structure is described below in conjunction with FIGS. 4A and 4B, and one embodiment of a hexagonal cell lattice structure is described below in conjunction with FIG. 5.

Figures 4A, 4B:
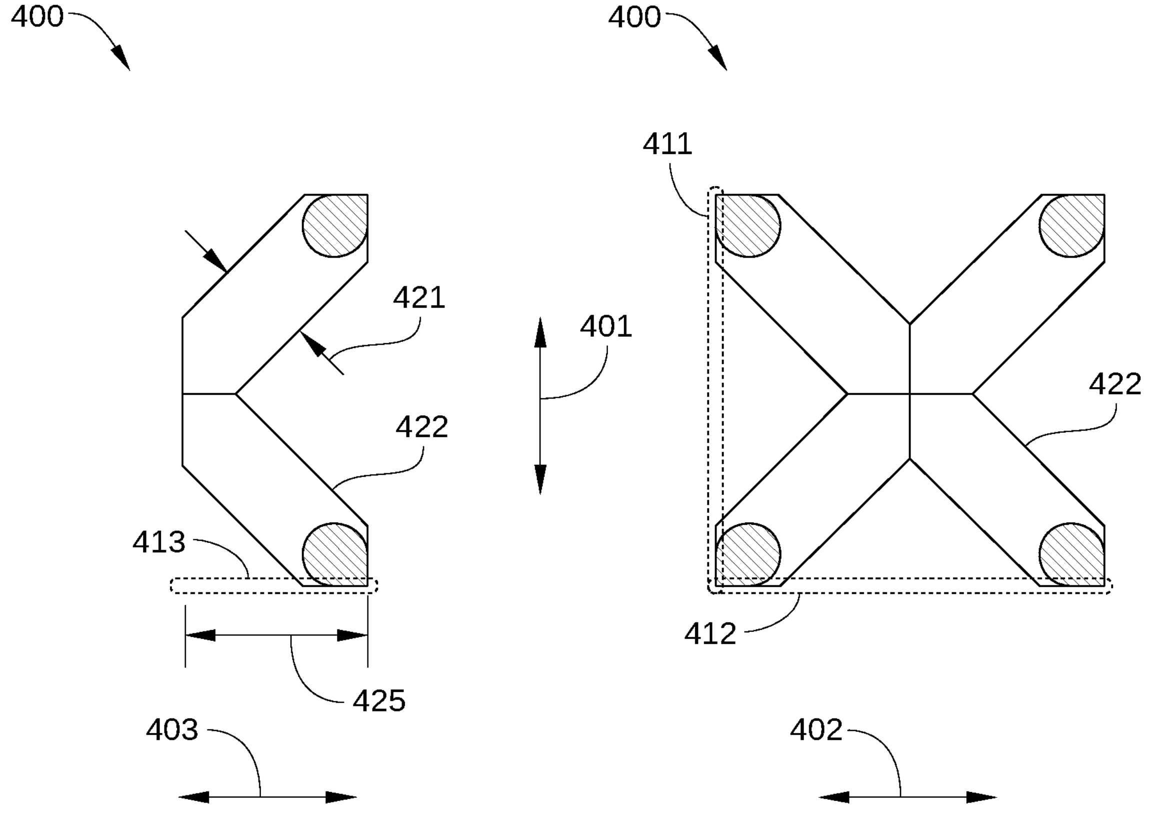
FIG. 4A is a side view of a unit cell of an X-topology lattice structure, according to various embodiments
FIG. 4B is a plan view of the unit cell of FIG. 4, according to various embodiments.

FIG. 4A is a side view of a unit cell 400 of an X-topology lattice structure, according to an embodiment, and FIG. 4B is a plan view of unit cell 400, according to an embodiment. Unit cell 400 is a repeating element of an X-topology lattice structure, such as 3D unit cells 311 of FIGS. 3A and 3B. As such, unit cell 400 can be the smallest group of structural members that can be assembled in a repeating pattern (for example via repetitive translation of the unit cell in one or more directions) to form a lattice included in a variable stiffness structure. For example, a plurality of unit cells 400 can be assembled to form lattice 310 included in shoe midsole 300 of FIGS. 3A and 3B. It is noted that each portion of a variable stiffness structure for which lattice engine 130 selects a value of a stiffness attribute can include a single unit cell 400 or multiple contiguous unit cells 400. For example, each portion 312 of lattice 310 in FIGS. 3A and 3B can include a single unit cell 400 or multiple contiguous unit cells 400.

Generally, unit cell 400 is symmetrical in configuration along at least one dimension or directional axis. In the embodiment illustrated in FIGS. 4A and 4B, unit cell 400 is symmetrical along two dimensions: an x-direction 401 and a y-direction 402. Thus, in the embodiment illustrated in FIGS. 4A and 4B, edge 411 of unit cell 400 is equal in length to edge 412 of unit cell 400. By contrast, edge 413, which is oriented parallel to a z-direction 403 that is orthogonal to x-direction 401 and y-direction 402, has a different length than edge 411 and 412.

In general, a stiffness attribute for a particular portion of the variable stiffness structure is based on one or more physical attributes of the unit cells included in that particular portion of the variable stiffness structure. Thus, in embodiments in which a variable stiffness structure includes an X-topology lattice structure, a stiffness attribute for a particular portion of the variable stiffness structure is based on one or more physical attributes of the unit cells 400 included in that particular portion of the variable stiffness structure. For example, for unit cell 400, suitable physical attributes include a beam diameter or thickness 421 of some or all beams 422 of unit cell 400, a ratio of a beam length 423 to be diameter or thickness 421, a beam intersection angle, and the like. In embodiments in which lengths of edges 411 and 412 are constant and a length 425 of edge 413 can be varied to modify a stiffness of unit cell 400 with respect to a load exerted on an interface surface of the variable stiffness structure, a physical attribute of unit cell 400 can include a ratio of an area defined by edges 411 and 412 to length 425.

Figure 5:
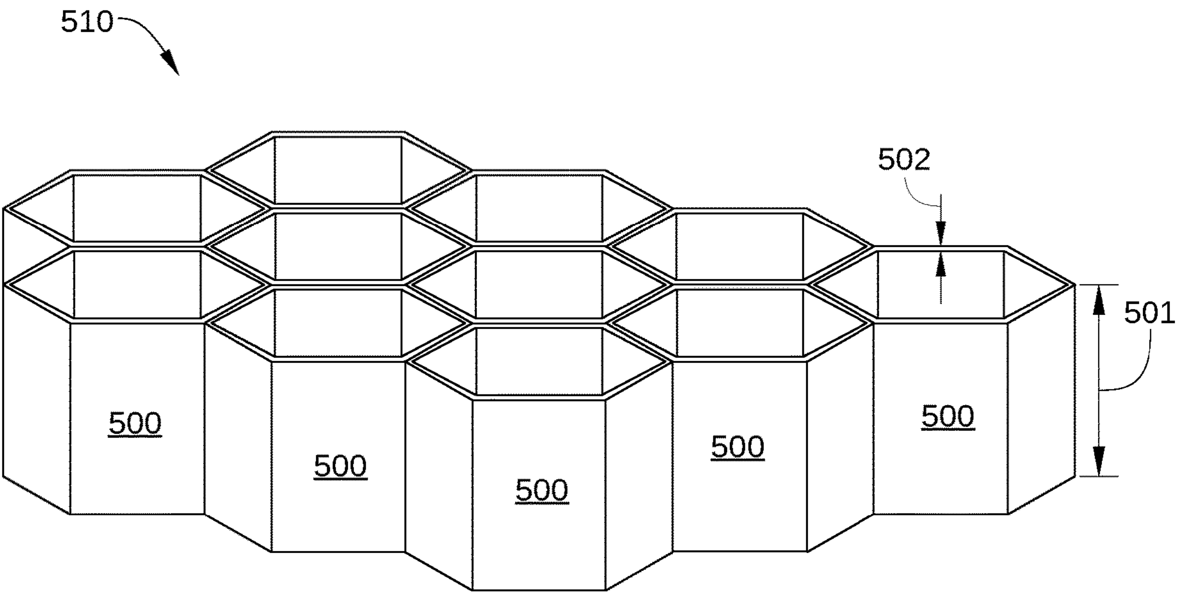
FIG. 5 is a perspective view of a multiple unit cells in a portion of a hexagonal cell lattice structure, according to various embodiments.

FIG. 5 is a perspective view of a plurality of unit cells 500 in a portion of a hexagonal cell lattice structure 510, according to an embodiment. Hexagonal cell lattice structure 510 includes a plurality of repeating elements (unit cells 500). Each of unit cells 500 can have a different height 501 that corresponds to thickness 304 in FIG. 3A. In addition, each of unit cells 500 can have a different wall thickness 502. By forming a particular unit cell 500 of hexagonal cell lattice structure 510 with a specific wall thickness 502, a stiffness of that particular unit cell 500 can be selected. Thus, in embodiments in which a variable stiffness structure includes a lattice structure similar to hexagonal cell lattice structure 510, a physical attribute of unit cell 500 can be wall thickness 502. Alternatively or additionally, unit cells 500 can include additional support members, such as diagonal cross beams (not shown). In such embodiments, a physical attribute such unit cells can be a beam diameter or thickness (not shown) of some or all beams of such unit cells. Any other technically feasible physical attributes of unit cells 500 that can be modified by the addition or removal of material from a unit cell 500 can also be employed as a physical attribute on which a stiffness attribute for the unit cell 500 is based.

Returning to FIG. 1, each lattice stiffness library 151 includes stiffness attributes for a specific structure to be optimized by lattice engine 130. In addition to lattice type and unit cell information, each specific structure is defined by material type and structure design. For example, the structure design can be an insole of a specific model of shoe.

In some embodiments, each lattice stiffness library 151 includes size-related scaling information (such as shoe size) for the design associated with that particular lattice stiffness library 151. In such embodiments, lattice engine 130 may optimize a specific structure for a default size, then scale the resulting optimized variable stiffness structure up or down to the actual size indicated by the size-related scaling information included in the lattice stiffness library 151 for the specific structure.

In addition, each lattice stiffness library 151 includes a loft surface for determining a stiffness attribute for each of the various portions of the variable stiffness structure to be optimized by lattice engine 130. In some embodiments, the loft surface is a graph of a two-variable function that has a surface of solutions in a 3D solution space. That is, each lattice stiffness library 151 includes a loft curve that indicates a specific value of a stiffness attribute for each portion of the variable stiffness structure associated with the lattice stiffness library 151. The stiffness attribute for a particular portion of the variable stiffness structure is a function of the thickness of that particular portion (e.g., thickness 304 in FIG. 3A) and a specific use-case pressure to be applied to the surface of the portion. The specific use-case pressure to be applied to the surface of the portion is a based on pressure information included in personal pressure map 111. Thus, the loft curve in a lattice stiffness library 151 enables the selection of a value for a stiffness attribute for each portion of the variable stiffness structure associated with the lattice stiffness library 151, based on the thickness of the portion and on personal pressure map 111. Additionally or alternatively, in some embodiments, in lieu of the graph of the two-variable function, each lattice stiffness library 151 includes numerical data that can be represented by the above-described graph.

Generating Library of Stiffness Attributes

According to various embodiments, the values for the stiffness attribute included in the loft curve of a lattice stiffness library 151 for a particular variable stiffness structure are generated via non-linear simulation finite element analysis of individual portions of the variable stiffness structure. More specifically, a different non-linear simulation, under different conditions, is performed to determine each value for the stiffness attribute, and the determined value is then stored and/or tabulated for constructing the loft curve. Once the stiffness attribute is determined for a sufficient number of different conditions, the loft curve can be generated, and the lattice engine 130 can employ the loft curve to quickly look up suitable values for stiffness attributes for a particular variable stiffness structure. A process for generating the above-described loft curve for a particular variable stiffness structure is described below in conjunction with FIG. 6.

Figure 6:
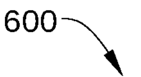
FIG. 6 sets forth a flowchart of method steps for generating a library of stiffness attribute values for various portions of a variable stiffness structure, according to various embodiments.
Figure 6:
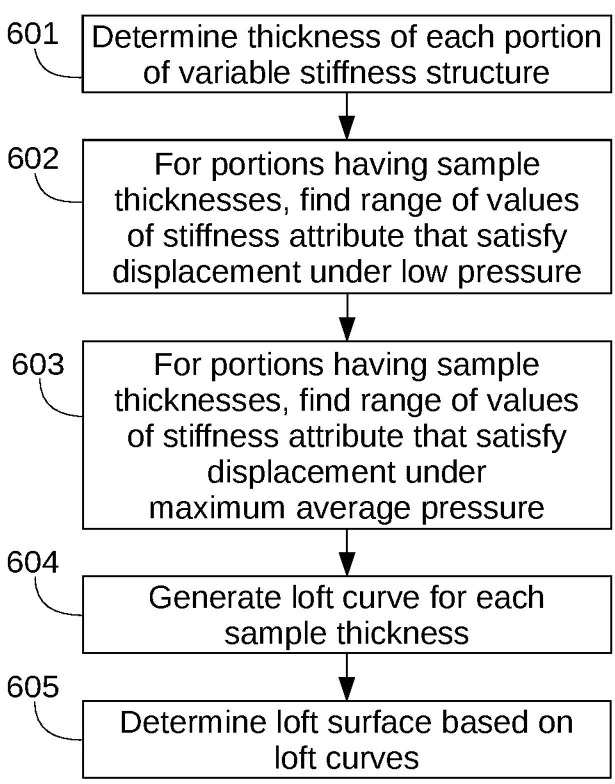

FIG. 6 sets forth a flowchart of method steps of generating a library of stiffness attribute values for portions of a variable stiffness structure, according to various embodiments. Although the method steps are described in conjunction with the systems of FIGS. 1-5, persons skilled in the art will understand that any system configured to perform the method steps, in any order, is within the scope of the embodiments.

Prior to the method steps, a specific structure to be analyzed is defined, including material of the structure, lattice included in the structure, the unit size to be analyzed, the stiffness attribute to be modified for each portion of the structure, and a maximum average pressure to be exert on the interface surface of the variable stiffness structure during use. The unit size to be analyzed corresponds to a portion 312 of shoe midsole 300. Thus, the unit size to be analyzed may include one unit cell 311, a column of units cells 311, or some other group of contiguous unit cells 311. In some embodiments, a physical model of the specific structure and/or a unit of the specific support structure is formed via a 3D printing process and validated for durability through fatigue testing and/or testing for any other applicable failure modes.

As shown, a method 600 begins at step 601, where a thickness 304 of each portion 312 of the variable stiffness structure (e.g., shoe midsole 300) is determined from the definition of the specific structure being analyzed.

In step 602, non-linear simulation, via finite element analysis, is used to find a range of values for the stiffness attribute that satisfies a target displacement under a low pressure on portions 312 of the variable stiffness structure. For example, in an embodiment, the stiffness attribute is a thickness or diameter of beams included in the unit cells of a lattice included in the variable stiffness structure. In some embodiments, the low pressure is based on the maximum average pressure defined for the variable stiffness structure. For example, in some embodiments, the low pressure employed in step 602 is a specific fraction of the maximum average pressure, such as one tenth of the maximum average pressure to be experienced by the variable stiffness structure. The range of values for the stiffness attribute includes a value for the stiffness attribute for each of a range of sample thicknesses 304. For example, in an embodiment in which the variable stiffness structure is a shoe midsole that varies from 12 to 22 mm in thickness, a value for the stiffness attribute that satisfies a target displacement under the low pressure is calculated for a portion 312 that is 12 mm in thickness, 14.5 mm in thickness, 17 mm in thickness, 19.5 mm in thickness, and 22 mm in thickness. In addition, in some embodiments, a resulting displacement is determined for each of the above thicknesses that occurs in response to the low pressure being exerted on that portion 312. The resulting displacement is based on the value for the stiffness attribute that is determined for that portion 312. Thus, the value determined for a resulting displacement of a particular portion 312 indicates a displacement of an interaction surface of that particular portion 312 in response to the low pressure being exerted on that particular portion 312 when that particular portion 312 is configured with the stiffness attribute value (for example, with a specific beam diameter or thickness).

In step 603, non-linear simulation similar to that of step 602 is performed on portions 312 having the same range of thickness 304 as in step 602. However, in step 603, each value for the stiffness attribute determined in step 603 satisfies a target displacement under maximum average pressure on portions 312 of the variable stiffness structure. Thus, in an embodiment in which the variable stiffness structure is a shoe midsole that varies from 12 to 22 mm in thickness, a value for the stiffness attribute that satisfies a target displacement under the maximum average pressure is calculated for a portion 312 that is 12 mm in thickness, 14.5 mm in thickness, 17 mm in thickness, 19.5 mm in thickness, and 22 mm in thickness.

In step 604, a loft curve (displacement vs. stiffness attribute value curve) is generated for each of the sample thicknesses 304 of steps 602 and 603. An example of output generated by the non-linear simulation of step 603 and employed to generate such loft curves is shown in FIG. 7.

FIG. 7 illustrates stiffness attribute values 701 generated via non-linear simulation that satisfy displacement under maximum average pressure on a portion 312 of the variable stiffness structure, according to an embodiment. As shown, stiffness attribute values 701 are generated for each sample thickness 304 (12 mm, 14.5 mm, 17 mm, 19.5 mm, and 22 mm) used to construct a curve of stiffness attribute values 701 vs. displacements 702 for each sample thickness 304. In FIG. 7, displacement values 702 each indicate a simulated displacement of a portion 312 that occurs when the portion has a stiffness equal to a corresponding stiffness attribute and a maximum average pressure is applied to the interface surface of the portion.

Returning to FIG. 6, in step 605, a loft surface is determined based on the loft curves (displacement vs. stiffness attribute value) generated in step 604. Taken together, these five curves define a surface that represents all possible scenarios for displacement when pressure is exerted on a portion 312 vs. stiffness attribute value vs. thickness 304 of the portion 312. In some embodiments, a mirroring factor (also referred to as a scaling factor) is determined to facilitate generation of the loft surface. In such embodiments, for each loft curve, the mirroring factor M=T1/(T2−T3), where T1 is a first stiffness attribute value (e.g., a first beam thickness), T2 is a second stiffness attribute value (e.g., a second beam thickness), and T3 is a third stiffness attribute value (e.g., a third beam thickness). In such embodiments, for a particular loft curve, the first stiffness attribute value is a value determined for a portion 312 that provides half displacement when an intermediate pressure is applied to the portion, where the intermediate pressure is a pressure halfway between the maximum average pressure and the low pressure employed in steps 602 and 603. The second stiffness attribute value is a value determined for the portion 312 that provides maximum displacement when the maximum pressure is applied to the portion. The third stiffness attribute value is a value determined for the portion 312 that provides half displacement when the intermediate pressure is applied to the portion.

In alternative embodiments, the intermediate pressure is a pressure that is anywhere between the maximum average pressure and the low pressure employed in steps 602 and 603. In such embodiments, the half displacement is replaced with a displacement that is proportional to the position of the intermediate pressure between the maximum average pressure and the low pressure employed in steps 602 and 603.

Figure 8:
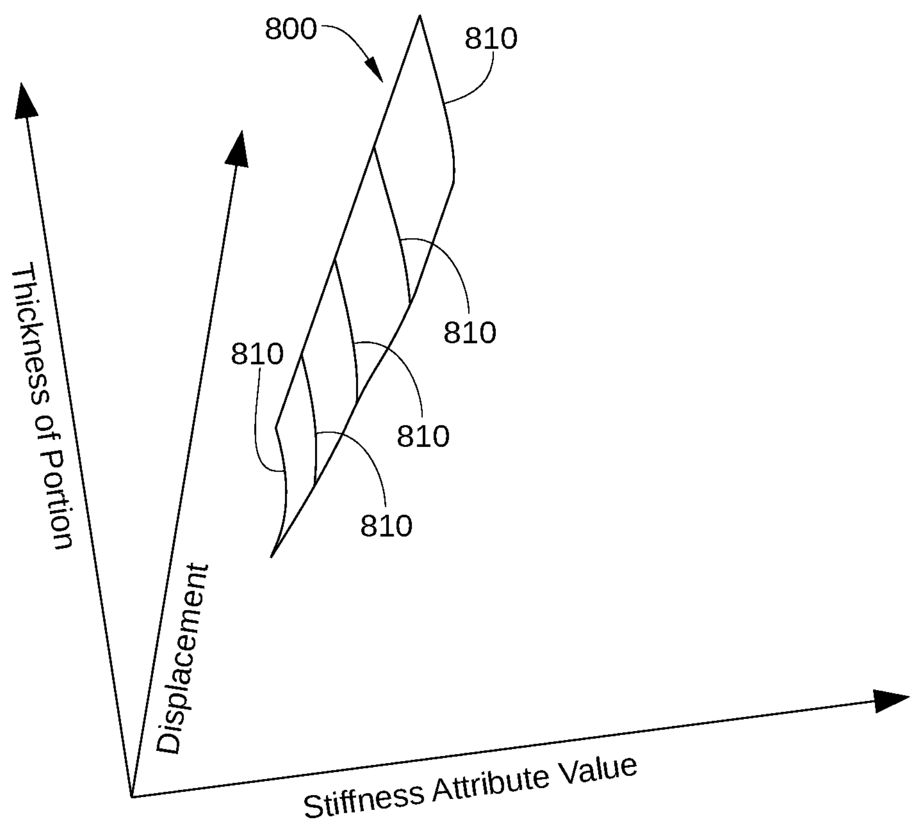
FIG. 8 illustrates a loft surface constructed based on the stiffness attribute values of FIG. 7, according to various embodiments.

FIG. 8 illustrates a loft surface 800 constructed based on the stiffness attribute values of FIG. 7, according to an embodiment. As shown, loft surface 800 is disposed in a space of: pressure exerted against a portion of the variable stiffness structure vs. stiffness attribute value of the portion vs. thickness of the portion. Loft surface 800 includes multiple loft curves 810, each one corresponding to a sample thickness 304 used to generate the values for loft surface 800. According to various embodiments, loft surface 800, or a data set that corresponds thereto, can be employed by lattice engine 130 to determine stiffness attribute values for portions 312 of a variable stiffness structure. One such embodiment is described below in conjunction with FIG. 9.

Designing and Printing a Variable Stiffness Structure

Figure 9:
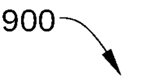
FIG. 9 sets forth a flowchart of method steps for designing and printing a variable stiffness structure, according to various embodiments.
Figure 9:
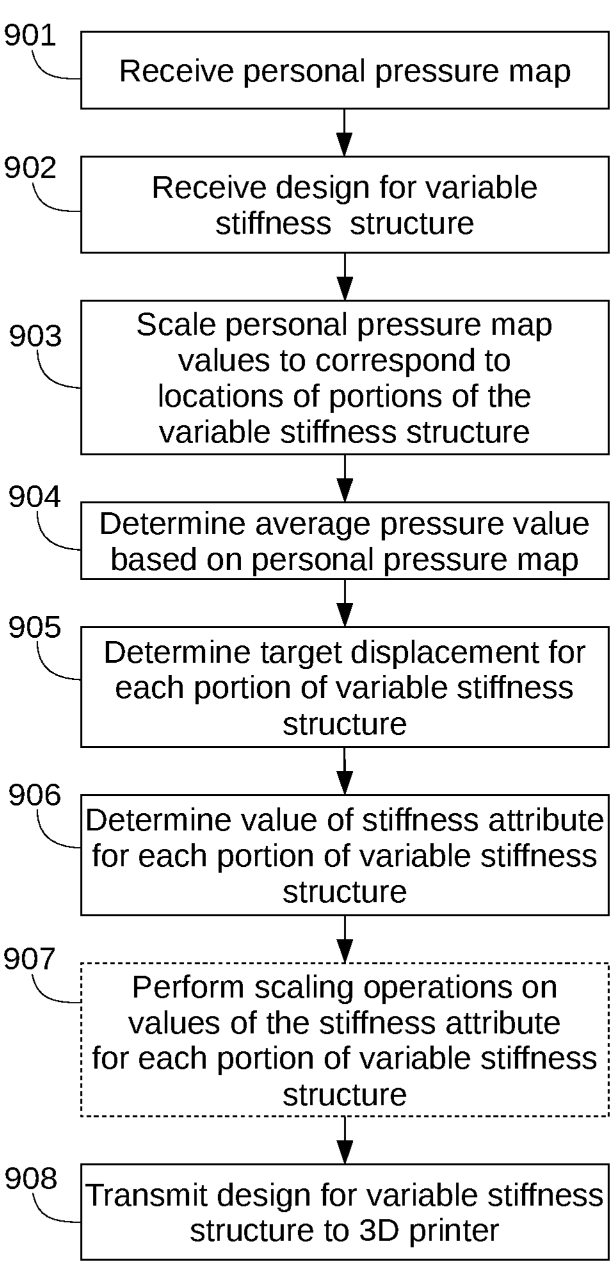

FIG. 9 sets forth a flowchart of method steps of generating a design for a variable stiffness structure, according to various embodiments. Although the method steps are described in conjunction with the systems of FIGS. 1-8, persons skilled in the art will understand that any system configured to perform the method steps, in any order, is within the scope of the embodiments. Prior to the method steps, a structure is defined and a lattice stiffness library 151 is generated for the structure, for example via method 600 of FIG. 6.

As shown, a method 900 begins at step 901, where lattice engine 130 receives a personal pressure map 111 for optimization of a structure, such as a shoe midsole, a seat cushion, a hand grip, and the like.

In step 902, lattice engine 130 receives variable stiffness structure design information 121 from design database 120.

In step 903, lattice engine 130 aligns, averages, or otherwise scales the pressure measurements associated with locations 201 included in personal pressure map 111 to appropriate pressure values that each correspond to a different location of a portion 312 of shoe midsole 300. In some embodiments, the scaled pressure values that correspond to the locations of portions 312 are formatted as a gray-scale bitmap of interface surface 301, where one pixel represents pressure measured at the location of a particular portion 312 of shoe midsole 300.

In step 904, lattice engine 130 determines an average pressure value based on the scaled pressure values determined in step 903.

In step 905, lattice engine 130 determines a target displacement for each portion 312 of shoe midsole 300. The target displacement for each portion 312 is determined based on the average pressure value determined in step 904 and the thickness of the portion 312. The target displacement for each portion 312 can be so determined using information included in the appropriate lattice stiffness library 151 for the specific structure being optimized.

In step 906, lattice engine 130 determines the value of the stiffness attribute (e.g., beam thickness) for each portion 312 by looking up the stiffness attribute for each portion 312 with the loft surface 800 included in the appropriate lattice stiffness library 151 for the specific structure being optimized. With the stiffness attribute for each portion 312 defined, the variable stiffness structure is ready to be fabricated by 3D printer 140.

In optional step 907, lattice engine 130 performs any necessary scaling operations to the design of the variable stiffness structure. For example, in an embodiment in which the variable stiffness structure is a component of variable-sized object, such as a shoe, lattice engine 130 scales the results determined in step 906 accordingly, since the lattice stiffness library 151 for the specific structure may be based on a specific size. In some embodiments, a scaling can be a linear multiplier. Alternatively, in other embodiments, a different lattice stiffness library 151 can be generated for each size of the variable stiffness structure.

In step 908, lattice engine 130 transmits the design for the variable stiffness structure to 3D printer 140 for fabrication, and 3D printer 140 forms the variable stiffness structure. In so doing, each portion 312 of the variable stiffness structure can have a different value for the stiffness attribute.

Figure 10:
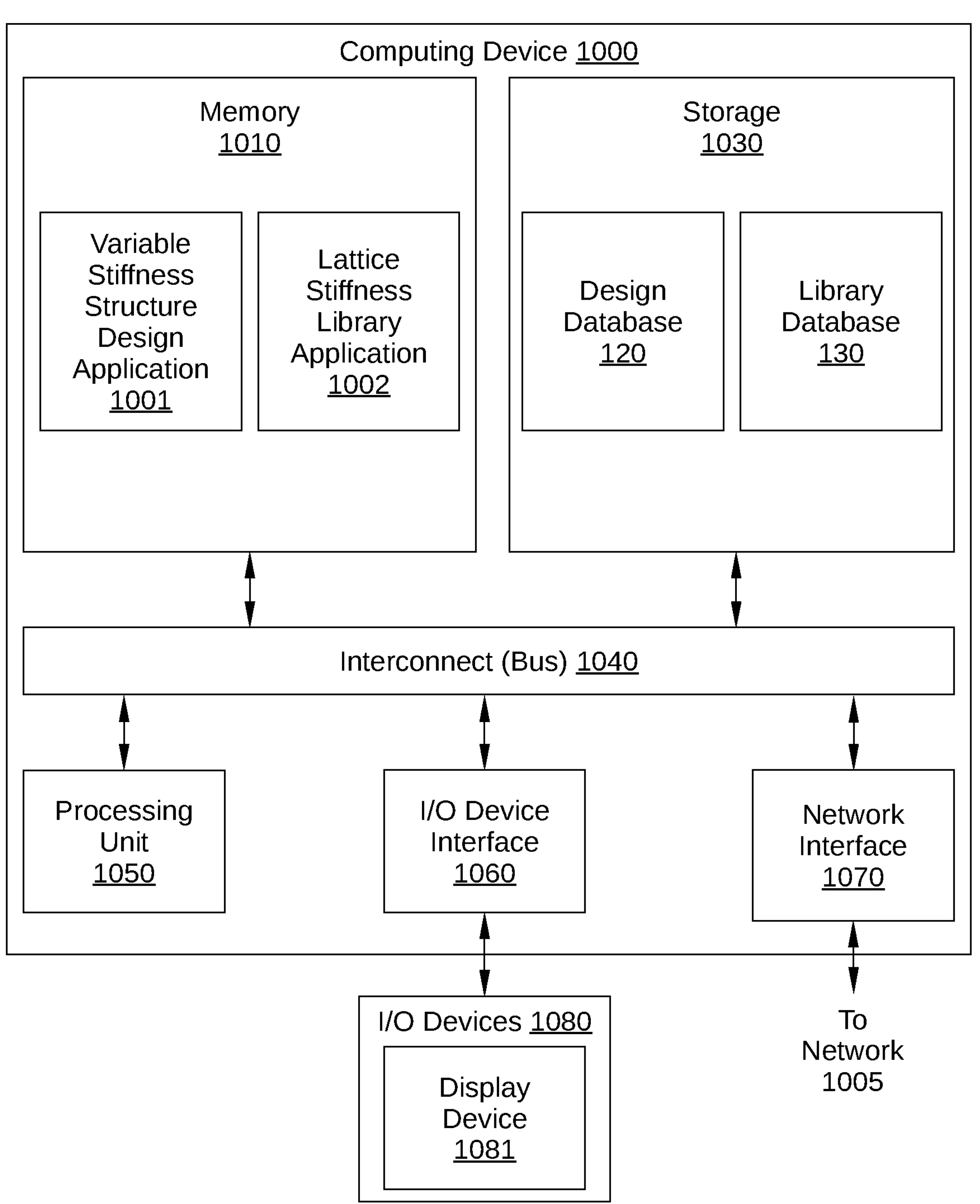
FIG. 10 is a block diagram of a computing device 1000 configured to implement one or more aspects of the present disclosure.

FIG. 10 is a block diagram of a computing device 1000 configured to implement one or more aspects of the various embodiments. Thus, computing device 1000 can be a computing device associated with design database 120, lattice engine 130, library database 150, and/or a computing device configured to generate lattice stiffness libraries 151. Computing device 1000 may be a desktop computer, a laptop computer, a tablet computer, or any other type of computing device configured to receive input, process data, generate control signals, and display images. Computing device 1000 is configured to run a variable stiffness structure design application 1001 for performing the operations of lattice engine 130, a lattice stiffness library application 1002 for generating lattice stiffness libraries 151, and/or other suitable software applications, which can reside in a memory 1010. It is noted that the computing device described herein is illustrative and that any other technically feasible configurations fall within the scope of the present disclosure.

As shown, computing device 1000 includes, without limitation, an interconnect (bus) 1040 that connects a processing unit 1050, an input/output (I/O) device interface 1060 coupled to input/output (I/O) devices 1080, memory 1010, a storage 1030, and a network interface 1070. Processing unit 1050 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit 1050 may be any technically feasible hardware unit capable of processing data and/or executing software applications, including variable stiffness structure design and/or lattice stiffness library application 1002. Further, in the context of this disclosure, the computing elements shown in computing device 1000 may correspond to a physical computing system (e.g., a system in a data center) or may be a virtual computing instance executing within a computing cloud.

I/O devices 1080 may include devices capable of providing input, such as a keyboard, a mouse, a touch-sensitive screen, and so forth, as well as devices capable of providing output, such as a display device 781. Additionally, I/O devices 1080 may include devices capable of both receiving input and providing output, such as a touchscreen, a universal serial bus (USB) port, and so forth. I/O devices 1080 may be configured to receive various types of input from an end-user of computing device 1000, and to also provide various types of output to the end-user of computing device 1000, such as one or more graphical user interfaces (GUI), displayed digital images, and/or digital videos. In some embodiments, one or more of I/O devices 1080 are configured to couple computing device 1000 to a network 1005.

Network 1005 may be any technically feasible type of communications network that allows data to be exchanged between computing device 1000 and external entities or devices, such as a smart device, a wearable smart device, a web server, or another networked computing device (not shown). For example, network 1005 may include a wide area network (WAN), a local area network (LAN), a wireless (WiFi) network, a Bluetooth network and/or the Internet, among others.

Memory 1010 may include a random access memory (RAM) module, a flash memory unit, or any other type of memory unit or combination thereof. Processing unit 1050, I/O device interface 1060, and network interface 1070 are configured to read data from and write data to memory 1010. Memory 1010 includes various software programs that can be executed by processor 1050 and application data associated with said software programs, including variable stiffness structure design and/or lattice stiffness library application 1002.

1. In some embodiments, a computer-implemented method of generating one or more variable stiffness structures includes: determining a thickness of a first portion of a variable stiffness structure; determining a pressure that is to be applied to a surface of the first portion; selecting a first predetermined value for a stiffness attribute based on the thickness of the first portion and the pressure; and generating a model of at least part of the variable stiffness structure that includes the first portion, wherein the first portion has the predetermined value for the stiffness attribute.
2. The computer-implemented method of clause 1, wherein, prior to being selected, the first predetermined value for the stiffness attribute is computed based on a first target displacement of the surface of the first portion that occurs when an average pressure is applied to a respective surface of each portion of a plurality of portions of the variable stiffness structure.
3. The computer-implemented method of clause 1 or 2, wherein the first target displacement of the surface is based on the thickness of the portion and the average pressure applied to the surface of the first portion.
4. The computer-implemented method of any of clauses 1-3, wherein the predetermined value for the stiffness attribute is computed via a non-linear static simulation of the first portion.
5. The computer-implemented method of any of clauses 1-4, wherein the target displacement is selected to reduce a differential between a first resultant pressure that is applied to the surface of the first portion and a second resultant pressure that is applied to a surface of a second portion of the variable stiffness structure that is adjacent to the first portion.
6. The computer-implemented method of any of clauses 1-5, wherein the first resultant pressure and the second resultant pressure result when a user contacts the variable stiffness structure and applies the pressure to the surface of the first portion.
7. The computer-implemented method of any of clauses 1-6, wherein the variable stiffness structure comprises a lattice structure that includes a plurality of portions.
8. The computer-implemented method of any of clauses 1-7, wherein the first portion of the variable stiffness structure comprises a unit cell of the lattice structure.
9. The computer-implemented method of any of clauses 1-8, wherein the stiffness attribute comprises a physical attribute of the single unit cell.
10. The computer-implemented method of any of clauses 1-9, wherein the physical attribute of the single unit cell comprises one of a beam diameter or a cell wall thickness.
11. In some embodiments, a non-transitory computer readable medium stores instructions that, when executed by a processor, cause the processor to perform the steps of: determining a thickness of a first portion of a variable stiffness structure; determining a pressure that is to be applied to a surface of the first portion; selecting a first predetermined value for a stiffness attribute based on the thickness of the first portion and the pressure; and generating a model of at least part of the variable stiffness structure that includes the first portion, wherein the first portion has the predetermined value for the stiffness attribute.
12. The non-transitory computer readable medium of clause 11, further comprising instructions that, when executed by a processor, cause the processor to perform the step of transmitting the model to a three-dimensional printer to form the first portion of the variable stiffness structure, wherein, once formed, the first portion has the predetermined value for the stiffness attribute.

13. The non-transitory computer readable medium of clauses 11 or 12, wherein determining the pressure that is to be applied to the surface of the first portion comprises determining a pressure value from a plurality of measured pressure values, wherein each measured pressure values is associated with a different location on the variable stiffness structure.
14. The non-transitory computer readable medium of any of clauses 11-13, wherein the first portion is included in a plurality of portions of the variable stiffness structure, and the steps of determining a thickness, determining a pressure, selecting, and generating are performed for each portion included in the plurality of portions other than the first portion.
15. The non-transitory computer readable medium of any of clauses 11-14, wherein, prior to being selected, the first predetermined value for the stiffness attribute is computed based on a first target displacement of the surface of the first portion that occurs when an average pressure is applied to a respective surface of each portion of a plurality of portions of the variable stiffness structure.
16. The non-transitory computer readable medium of any of clauses 11-15, wherein the first target displacement of the surface is based on the thickness of the portion and the average pressure applied to the surface of the first portion.
17. The non-transitory computer readable medium of any of clauses 11-16, wherein the predetermined value for the stiffness attribute is computed via a non-linear static simulation of the first portion.
18. The non-transitory computer readable medium of any of clauses 11-17, wherein the target displacement is selected to reduce a differential between a first resultant pressure that is applied to the surface of the first portion and a second resultant pressure that is applied to a surface of a second portion of the variable stiffness structure that is adjacent to the first portion.
19. In some embodiments, a system includes: a memory that stores instructions; and a processor that is coupled to the memory and is configured to perform the steps of, upon executing the instructions: determining a thickness of a first portion of a variable stiffness structure; determining a pressure that is to be applied to a surface of the first portion; selecting a first predetermined value for a stiffness attribute based on the thickness of the first portion and the pressure; and generating a model of at least part of the variable stiffness structure that includes the first portion, wherein the first portion has the predetermined value for the stiffness attribute.
20. The system of clause 19, further comprising a three-dimensional printer, wherein the processor is further configured to perform the step of transmitting the model to the three-dimensional printer to form the first portion of the variable stiffness structure, wherein, once formed, the first portion has the predetermined value for the stiffness attribute.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method of generating one or more variable stiffness structures, the method comprising:

determining a plurality of thicknesses for a plurality of portions of a variable stiffness structure;

receiving, from a physical pressure mapper device, a plurality of pressures applied to a surface of the plurality of portions, wherein each pressure of the plurality of pressures is measured by a separate individual pressure sensor included in the physical pressure mapper device;

performing a plurality of non-linear simulations of at least a subset of the plurality of portions to generate a loft surface, wherein the loft surface is a three-dimensional surface that depicts one or more values for one or more physical attributes of a structural member of a lattice structure for each portion of the plurality of portions as a function of the plurality of thicknesses for the plurality of portions and the plurality of pressures received from the physical pressure mapper device;

determining, based on the loft surface, one or more second values for the one or more physical attributes of the structural member of the lattice structure for each portion of the plurality of portions based on at least a subset of the plurality of thicknesses and at least a subset of the plurality of pressures; and automatically generating, via a software application, a three-dimensional (3D) design in a format suitable for processing by a 3D printer for at least part of the variable stiffness structure, wherein the structural member of the lattice structure for each portion of the plurality of portions has the one or more second values for the one or more physical attributes.

2. The computer-implemented method of claim 1, wherein, prior to being determined, the one or more values for the one or more physical attributes are computed based on a first target displacement of the surface of the plurality of portions that occurs when an average pressure is applied to a respective surface of each portion of the plurality of portions of the variable stiffness structure.

3. The computer-implemented method of claim 2, wherein the first target displacement of the surface is based on a thickness of a first portion and the average pressure applied to a surface of the first portion.

4. The computer-implemented method of claim 2, wherein the first target displacement is selected to reduce a differential between a first resultant pressure that is applied to a surface of a first portion and a second resultant pressure that is applied to a surface of a second portion of the variable stiffness structure that is adjacent to the first portion.

5. The computer-implemented method of claim 4, wherein the first resultant pressure and the second resultant pressure result when a user contacts the variable stiffness structure and applies the plurality of pressures to the surface of the plurality of portions.

6. The computer-implemented method of claim 1, wherein the variable stiffness structure comprises the lattice structure that includes the plurality of portions.

7. The computer-implemented method of claim 6, wherein a first portion of the variable stiffness structure comprises a unit cell of the lattice structure.

8. The computer-implemented method of claim 7, wherein the one or more physical attributes comprises a physical attribute of the unit cell.

9. The computer-implemented method of claim 8, wherein the physical attribute of the unit cell comprises one of a beam diameter or a cell wall thickness.

10. The computer-implemented method of claim 1, wherein the 3D printer processes the 3D design and performs an additive manufacturing process using a first material to fabricate a first physical object having the lattice structure and corresponding to a first portion of the 3D design using the first material, wherein, once formed, at least one structural member of the first physical object has the one or more second values for the one or more physical attributes.

11. The computer-implemented method of claim 10, wherein the lattice structure comprises a plurality of unit cells each having a plurality of cell walls, and the one or more values for the one or more physical attributes for each portion of the plurality of portions comprise one or more values for a cell wall thickness for one or more unit cells of each portion.

12. The computer-implemented method of claim 1, wherein performing the plurality of non-linear simulations to generate the loft surface comprises:

determining a first target displacement for a first portion included in the plurality of portions based on a predefined fraction of a maximum average pressure to be applied to the variable stiffness structure;

performing a first non-linear simulation, via finite element analysis, of the first portion to determine one or more third values for the one or more physical attributes associated with the first portion based on the first target displacement and the predefined fraction of the maximum average pressure;

determining a second target displacement for the first portion based on the maximum average pressure to be applied to the variable stiffness structure;

performing a second non-linear simulation, via finite element analysis, of the first portion to determine one or more fourth values for the one or more physical attributes associated with the first portion based on the second target displacement and the maximum average pressure; and generating the loft surface based on the one or more third values and the one or more fourth values for the one or more physical attributes.

13. A non-transitory computer readable medium storing instructions that, when executed by a processor, cause the processor to perform the steps of:

determining a plurality of thicknesses for a plurality of portions of a variable stiffness structure;

receiving, from a physical pressure mapper device, a plurality of pressures applied to a surface of the plurality of portions, wherein each pressure of the plurality of pressures is measured by a separate individual pressure sensor included in the physical pressure mapper device;

performing a plurality of non-linear simulations of at least a subset of the plurality of portions to generate a loft surface, wherein the loft surface is a three-dimensional surface that depicts one or more values for one or more physical attributes of a structural member of a lattice structure for each portion of the plurality of portions as a function of the plurality of thicknesses for the plurality of portions and the plurality of pressures received from the physical pressure mapper device;

determining, based on the loft surface, one or more second values for the one or more physical attributes of the structural member of the lattice structure for each portion of the plurality of portions based on at least a subset of the plurality of thicknesses and at least a subset of the plurality of pressures; and automatically generating, via a software application, a three-dimensional (3D) design in a format suitable for processing by a 3D printer for at least part of the variable stiffness structure, wherein the structural member of the lattice structure for each portion of the plurality of portions has the one or more values for the one or more physical attributes.

14. The non-transitory computer readable medium of claim 13, further comprising instructions that, when executed by the processor, cause the processor to perform the step of causing the 3D printer to process the 3D design and perform an additive manufacturing process using a first material to fabricate a first physical object having the lattice structure and corresponding to a first portion of the variable stiffness structure using the first material, wherein, once formed, at least one structural member of the first physical object has the one or more second values for the one or more physical attributes.

15. The non-transitory computer readable medium of claim 13, wherein determining the plurality of pressures that are to be applied to the surface of the plurality of portions comprises determining a pressure value from a plurality of measured pressure values, wherein each measured pressure values is associated with a different location on the variable stiffness structure.

16. The non-transitory computer readable medium of claim 13, wherein a first portion is included in the plurality of portions of the variable stiffness structure, and the steps of determining the plurality of thicknesses, determining the plurality of pressures, performing the plurality of non-linear simulations, determining the one or more values for the one or more physical attributes, and automatically generating are performed for each portion included in the plurality of portions other than the first portion.

17. The non-transitory computer readable medium of claim 13, wherein, prior to being determined, the one or more values for the one or more physical attributes are computed based on a first target displacement of the surface of the plurality of portions that occurs when an average pressure is applied to a respective surface of each portion of the plurality of portions of a variable stiffness structure.

18. The non-transitory computer readable medium of claim 17, wherein the first target displacement of the surface is based on a thickness of a first portion and the average pressure applied to a surface of the first portion.

19. The non-transitory computer readable medium of claim 17, wherein the first target displacement is selected to reduce a differential between a first resultant pressure that is applied to a surface of a first portion and a second resultant pressure that is applied to a surface of a second portion of the variable stiffness structure that is adjacent to the first portion.

20. A system, comprising:

a memory that stores instructions; and a processor that is coupled to the memory and is configured to perform the steps of, upon executing the instructions:

determining a plurality of thicknesses for a plurality of portions of a variable stiffness structure;

receiving, from a physical pressure mapper device, a plurality of pressures applied to a surface of the plurality of portions, wherein each pressure of the plurality of pressures is measured by a separate individual pressure sensor included in the physical pressure mapper device;

performing a plurality of non-linear simulations of at least a subset of the plurality of portions to generate a loft surface, wherein the loft surface is a three-dimensional surface that depicts one or more values for one or more physical attributes of a structural member of a lattice structure for each portion of the plurality of portions as a function of the plurality of thicknesses for the plurality of portions and the plurality of pressures received from the physical pressure mapper device;

determining, based on the loft surface, one or more second values for the one or more physical attributes of the structural member of the lattice structure for each portion of the plurality of portions based on at least a subset of the plurality of thicknesses and at least a subset of the plurality of pressures; and automatically generating, via a software application, a three-dimensional (3D) design in a format suitable for processing by a 3D printer for at least part of the variable stiffness structure, wherein the structural member of the lattice structure for each portion of the plurality of portions has the one or more values for the one or more physical attributes.

21. The system of claim 20, further comprising the 3D printer, wherein the processor is further configured to perform the step of causing the 3D printer to process the 3D design and perform an additive manufacturing process using a first material to fabricate a first physical object having the lattice structure and corresponding to a first portion of the 3D design using the first material, wherein, once formed, at least one structural member of the first physical object has the one or more second values for the one or more physical attributes.

* * * * *